United States Patent [19]

Yatsuda

[11] Patent Number: 4,973,875
[45] Date of Patent: Nov. 27, 1990

[54] SURFACE ELASTIC WAVE DEVICE
[75] Inventor: Hiromi Yatsuda, Mitaka, Japan
[73] Assignee: Nihon Musen Kabushiki Kaisha, Mitaka, Japan
[21] Appl. No.: 271,711
[22] Filed: Nov. 16, 1988
[30] Foreign Application Priority Data Nov. 17, 1987 [JP] Japan ............... 62-288556

[51] Int. Cl.$^5$ .......................... H01L 41/08
[52] U.S. Cl. ..................... 310/313 D; 310/313 B; 333/153; 333/195
[58] Field of Search ......... 310/313 A, 313 B, 313 C, 310/313 D; 333/151, 153, 194, 195

[56] References Cited

U.S. PATENT DOCUMENTS

| | | | |
|---|---|---|---|
| 3,818,379 | 6/1974 | Wauk, II ..................... | 310/313 R |
| 3,845,420 | 10/1974 | Holland et al. ............. | 310/313 DX |
| 3,883,831 | 5/1975 | Williamson et al. ........ | 310/313 DX |
| 4,203,082 | 5/1980 | Tsukamoto et al. ........ | 333/194 |
| 4,600,905 | 7/1986 | Fredricksen ................ | 310/313 B X |

FOREIGN PATENT DOCUMENTS

| | | |
|---|---|---|
| 2409046 | 9/1974 | Fed. Rep. of Germany . |
| 2656154 | 7/1977 | Fed. Rep. of Germany . |
| 2824371 | 1/1979 | Fed. Rep. of Germany . |
| 2831584 | 2/1979 | Fed. Rep. of Germany . |
| 3536704 | 4/1986 | Fed. Rep. of Germany . |
| 0279678 | 8/1987 | European Pat. Off. . |
| 0726646 | 4/1980 | U.S.S.R. ........................ 333/153 |
| 1450865 | 9/1976 | United Kingdom . |

Primary Examiner—Mark O. Budd
Attorney, Agent, or Firm—Burns, Doane, Swecker & Mathis

[57] ABSTRACT

A surface elastic wave filter for processing a supplied signal into a signal with nonlinear-phase frequency characteristics has a piezoelectric substrate for propagating a surface elastic wave through a surface layer thereof and spaced input and output electrodes disposed on the surface layer for sending and receiving the surface elastic wave. Each of the input and output electrodes has a pair of common electrodes having comb-shaped interdigitating electrode fingers extending therebetween. The central electrode fingers of the input and output electrodes have central axes across the direction of propagation of the surface elastic wave. The distance along the direction of propagation between the central axes is varied in the direction substantially normal to the direction of propagation. The surface elastic wave filter may include an electric conductor disposed on the piezoelectric substrate between the input and output electrodes and having a dimension in the direction of propagation, the dimension being varied in the direction substantially normal to the direction of propagation. A medium for varying the speed of propagation of the surface elastic wave may be positioned in place of the electric conductor.

10 Claims, 13 Drawing Sheets

SURFACE ELASTIC WAVE DEVICE

BACKGROUND OF THE INVENTION

The present invention relates to a surface elastic wave device, and more particularly to a surface elastic wave device having input and output electrodes disposed on a surface layer of a piezoelectric body for sending and receiving a surface elastic wave between the electrodes to produce a signal having desired frequency characteristics from a supplied high-frequency signal.

Surface elastic wave devices utilize the properties of a surface elastic wave such that most of its energy is propagated along a surface of a solid body. Such surface elastic wave devices are widely used in oscillator circuits, filter circuits, delay circuits, and the like in various pieces of communication or electronic equipment. The surface elastic wave device comprises, for example, a piezoelectric crystal body with a ground surface and input and output electrodes in form the of a pair of thin metallic films on the surface of the piezoelectric crystal body for sending and receiving a surface elastic wave between the electrodes. More specifically, when the input electrode on the piezoelectric crystal body is supplied with a high-frequency signal, the piezoelectric body vibrates due to the piezoelectric effect, and the vibration is transmitted from the input electrode and propagated as an elastic wave along the surface of the piezoelectric body toward the output electrode. The output electrode receives the elastic wave and issues a high-frequency output signal which is produced by the reverse piezoelectric effect of the piezoelectric body.

Recently, surface elastic wave devices have been finding wide use as filters since the phase or amplitude characteristics thereof can be selected as desired.

FIG. 1 of the accompanying drawings illustrates a conventional surface elastic wave filter of a basic configuration. The surface elastic wave filter has a piezoelectric substrate 12 and a pair of input and output electrodes 16, 18 disposed on the piezoelectric substrate 12 in spaced-apart relationship. The input and output electrodes 16, 18 have common electrodes 16a, 16b and 18a, 18b, respectively. The input electrode 16 includes a plurality of parallel interdigitating electrode fingers 20a, 20b, 20c, 20d, 20e extending between the common electrodes 16a, 16b. The output electrode 18 includes a plurality of parallel interdigitating electrode fingers 24a, 24b, 24c, 24d, 24e extending between the common electrodes 18a, 18b.

A high-frequency signal $S_1$ is applied to the input electrode 16 between the common electrodes 16a, 16b, and a high-frequency signal $S_2$ having desired frequency characteristics is produced from the output electrode 18 between the common electrodes 18a, 18b.

While the basic configuration of the surface elastic wave filter is shown in FIG. 1, the interdigitating electrode fingers may be modified in shape in an actual application to obtain desired output signal frequency characteristics. For example, the interdigitating electrode fingers may be shaped to widen the passband of the filter and eliminate ripples from the frequency characteristics in the passband.

Another conventional surface elastic wave filter is illustrated in FIG. 2 of the accompanying drawings. The surface elastic wave filter comprises a piezoelectric substrate 23 and a pair of input and output electrodes 36, 38 disposed on the piezoelectric substrate 23 in spaced-apart relationship. The input and output electrodes 36, 38 have common electrodes 36a, 36b and 38a, 38b, respectively. The input electrode 36 includes divergent electrode fingers 40a, 40b, 40c positioned between the common electrodes 36a, 36b and electrode fingers 40d, 40e disposed in spaces defined between the electrode fingers 40a, 40b, 40c in interdigitating relationship. Similarly, the output electrode 38 also includes divergent electrode fingers 44a, 44b, 44c and electrode fingers 44d, 44e disposed between the common electrodes 38a, 38b in interdigitating relationship. The pitch or distance, in the direction x in which the surface elastic wave is propagated, between adjacent two of the electrode fingers from each of the common electrodes 36b, 38b progressively varies from a minimum value of $P_L$ to a maximum value of $P_H$ across propagation paths a through n which are juxtaposed in a direction y normal to the direction x of propagation on the piezoelectric substrate 32.

The common electrodes 36a, 36b are supplied with a high-frequency signal $S_4$ therebetween, and a high-frequency signal $S_5$ having desired frequency characteristics is picked up from between the common electrodes 38a, 38b.

It may be considered that the interdigitating electrodes of the shape shown in FIG. 2 provide a number of parallel-connected surface elastic filters having different interelectrode pitches in respective small segments $\Delta y$ in the direction y.

As is well known in the art, the frequencies that can be passed through a surface elastic wave filter are determined by the interelectrode pitch. Assuming that the speed of propagation of a surface elastic wave through the filter of FIG. 2 is indicated by v, the frequencies that can be passed through the filter range from:

$$f_L = P_L/v \ldots \quad (1)$$

to $$f_H = P_H/v \ldots \quad (2)$$

In this frequency range, the pitch P(y) in the direction y normal to the direction x of propagation of the surface elastic wave smoothly varies. The frequency range is wide with no ripples therein. In the arrangement of FIG. 2, the interelectrode pitch is varied in each of the input and output electrodes 36, 38. However, the interelectrode pitch of the interdigitating electrode fingers in either one of the input and output electrodes 36, 38 may be varied. FIG. 3 shows phases and amplitudes (insertion losses) at respective frequencies of the surface elastic wave filter of FIG. 2, and FIG. 4 illustrates phases and insertion losses at respective frequencies of the surface elastic wave filter of FIG. 2.

The surface elastic wave filter shown in FIG. 2 is capable of providing linear-phase frequency characteristics in a relatively wide range, but fails to achieve nonlinearphase frequency characteristics.

More specifically, a signal which has passed through an LC filter suffers overshooting or undershooting due to the transient of the filter, and hence the signal from the filter has a distorted leading or trailing edge, i.e., a characteristic deterioration such as curved group delay characteristics is developed. To avoid this problem, a signal produced from an LC filter is passed through a surface elastic wave filter in many instances, so that desired amplitude and phase characteristics will be given to the signal by the surface elastic wave filter. Where such a surface elastic wave filter is employed, more accurate characteristics are desired, and ripples produced by the surface elastic wave filter itself may cause a problem. There is therefore a demand for a surface elastic wave filter which can provide nonlinear-phase frequency characteristics with low ripples and has a wide frequency range.

SUMMARY OF THE INVENTION

It is a major object of the present invention to provide a surface elastic wave device having input and output electrodes disposed on a surface layer of a piezoelectric body for sending and receiving a surface elastic wave between the electrodes, the surface elastic wave device including either an electric conductor disposed between the input and output electrodes and having a length in the direction of propagation of the surface elastic wave, the length being varied in a direction normal to the direction of propagation of the surface elastic wave to vary the speed of propagation of the surface elastic wave due to different electric boundary conditions, or a medium disposed on the surface layer between the input and output electrodes for varying the speed of propagation of the surface elastic wave through the surface layer, so that a signal supplied to the input electrode will be produced as an output signal from the output electrode which has desired frequency characteristics in a wide frequency range, and the desired frequency characteristics can accurately be achieved in a wide frequency range with greater freedom.

Another object of the present invention is to provide a surface elastic wave device having nonlinear-phase frequency characteristics, comprising a piezoelectric body for propagating a surface elastic wave through a surface layer thereof and first and second electrodes disposed on said surface layer in spaced apart relationship to each other for sending and receiving the surface elastic wave between the first and second electrodes, each of said first and second electrodes having a pair of common electrodes having comb-shaped electrode fingers extending therebetween, said electrode fingers between the common electrodes of at least one of said first and second electrodes including a plurality of divergent electrode fingers spreading along a direction substantially normal to the direction of propagation of the surface elastic wave and an electrode finger disposed in a space defined between said divergent electrode fingers, the electrode finger of said first electrode for substantially sending and receiving the surface elastic wave having a central axis across said direction of propagation, the electrode finger of said second electrode for substantially sending and receiving the surface elastic wave having a central axis across said direction of propagation, the distance along said direction of propagation between said central axes being varied in said direction substantially normal to said direction of propagation.

Still another object of the present invention is to provide a surface elastic wave device, further comprising an electric conductor disposed on said surface layer of the piezoelectric body and having a length in said direction of propagation, said length being varied in said direction substantially normal to said direction of propagation, said electric conductor comprising a metallized layer.

Yet another object of the present invention is to provide a surface elastic wave device, wherein those electrode fingers which are disposed between said central axes comprise electrode conductors, and further comprising an electric conductor disposed on said surface layer of the piezoelectric body and having a length in said direction of propagation, said length being varied in said direction substantially normal to said direction of propagation, said electric conductors comprising metallized layers, respectively.

Yet still another object of the present invention is to provide a surface elastic wave device having nonlinear-phase frequency characteristics, comprising a piezoelectric body for propagating a surface elastic wave through a surface layer thereof, first and second electrodes disposed on said surface layer in spaced-apart relationship to each other for sending and receiving the surface elastic wave between the first and second electrodes, and an electric conductor disposed on said surface layer of the piezoelectric body between said first and second electrodes and having a length in said direction of propagation, said length being varied in said direction substantially normal to said direction of propagation, each of said first and second electrodes having a pair of common electrodes having comb-shaped electrode fingers extending therebetween, said electrode fingers between the common electrodes of at least one of said first and second electrodes including a plurality of divergent electrode fingers spreading along a direction substantially normal to the direction of propagation of the surface elastic wave and an electrode finger disposed in a space defined between said divergent electrode fingers.

A further object of the present invention is to provide a surface elastic wave device having nonlinear-phase frequency characteristics, comprising a piezoelectric body for propagating a surface elastic wave through a surface layer thereof, and first and second electrodes disposed on said surface layer in spaced-apart relationship to each other for sending and receiving the surface elastic wave between the first and second electrodes, each of said first and second electrodes having a pair of common electrodes having comb-shaped electrode fingers extending therebetween, said electrode fingers between the common electrodes of at least one of said first and second electrodes including a plurality of divergent electrode fingers spreading along a direction substantially normal to the direction of propagation of the surface elastic wave and an electrode finger disposed in a space defined between said divergent electrode fingers, the central electrode finger of said first electrode having a central axis and the central electrode finger of said second electrode having a central axis, those electrode fingers of said first electrode and/or said second electrode which are disposed between said central axes comprising electric conductors, each of said electric conductors having a length in said direction of propagation, said length being varied in said direction substantially normal to said direction of propagation.

A still further object of the present invention is to provide a surface elastic wave device, further comprising an electric conductor disposed on said surface layer of the piezoelectric body and having a length in said direction of propagation, said length being varied in said direction substantially normal to said direction of propagation, said electric conductor comprising a metallized layer.

A yet further object of the present invention is to provide a surface elastic wave device, wherein those electrode fingers which are disposed between said central axes comprise electrode conductors, and further comprising an electric conductor disposed on said surface layer of the piezoelectric body and having a length in said direction of propagation, said length being varied in said direction substantially normal to said direction of propagation, said electric conductors comprising metallized layers, respectively.

A yet still further object of the present invention is to provide a surface elastic wave device having nonlinear-phase frequency characteristics, comprising a piezoelectric body for propagating a surface elastic wave through a surface layer thereof, first and second electrodes disposed on said surface layer in spaced-apart relationship to each other for sending and receiving the surface elastic wave between the first and second electrodes, each of said first and second electrodes having a pair of common electrodes having comb-shaped electrode fingers extending therebetween, said electrode fingers between the common electrodes of at least one of said first and second electrodes including a plurality of divergent electrode fingers spreading along a direction substantially normal to the direction of propagation of the surface elastic wave and an electrode finger disposed in a space defined between said divergent electrode fingers, and an electric conductor disposed on said surface layer of the piezoelectric body between said first and second electrodes and having a length in said direction of propagation, said length being varied in said direction substantially normal to said direction of propagation, and/or the central electrode finger of said first electrode having a central axis and the central electrode finger of said second electrode having a central axis, those electrode fingers of said first electrode and/or said second electrode which are disposed between said central axes comprising electric conductors, each of said electric conductors having a length in said direction of propagation, said length being varied in said direction substantially normal to said direction of propagation.

Still another object of the present invention is to provide a surface elastic wave device having nonlinear-phase frequency characteristics, comprising a piezoelectric body for propagating a surface elastic wave through a surface layer thereof, first and second electrodes disposed on said surface layer in spaced-apart relationship to each other for sending and receiving the surface elastic wave between the first and second electrodes, each of said first and second electrodes having a pair of common electrodes having combshaped electrode fingers extending therebetween, said electrode fingers between the common electrodes of at least one of said first and second electrodes including a plurality of divergent electrode fingers spreading along a direction substantially normal to the direction of propagation of the surface elastic wave and an electrode finger disposed in a space defined between said divergent electrode fingers, and a medium disposed across propagation channels between said first and second electrodes for varying the speed of propagation of the surface elastic wave through said surface layer.

Yet another object of the present invention is to provide a surface elastic wave device, wherein said medium comprises a thin film of silicon dioxide.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 1:
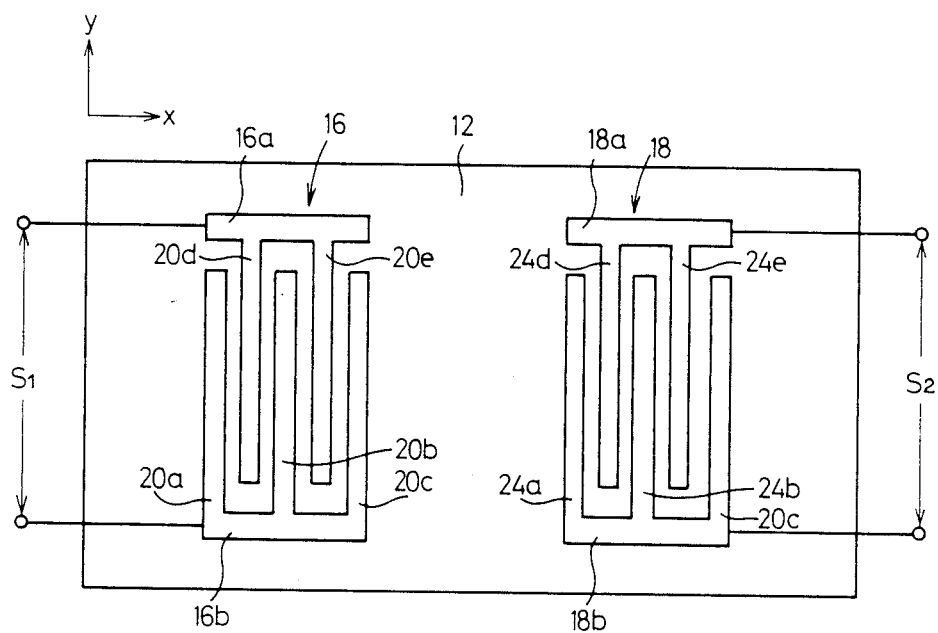
FIG. 1 is a plan view of a conventional surface elastic wave filter with input and output electrodes disposed on a surface layer of a piezoelectric body.
Figure 2:
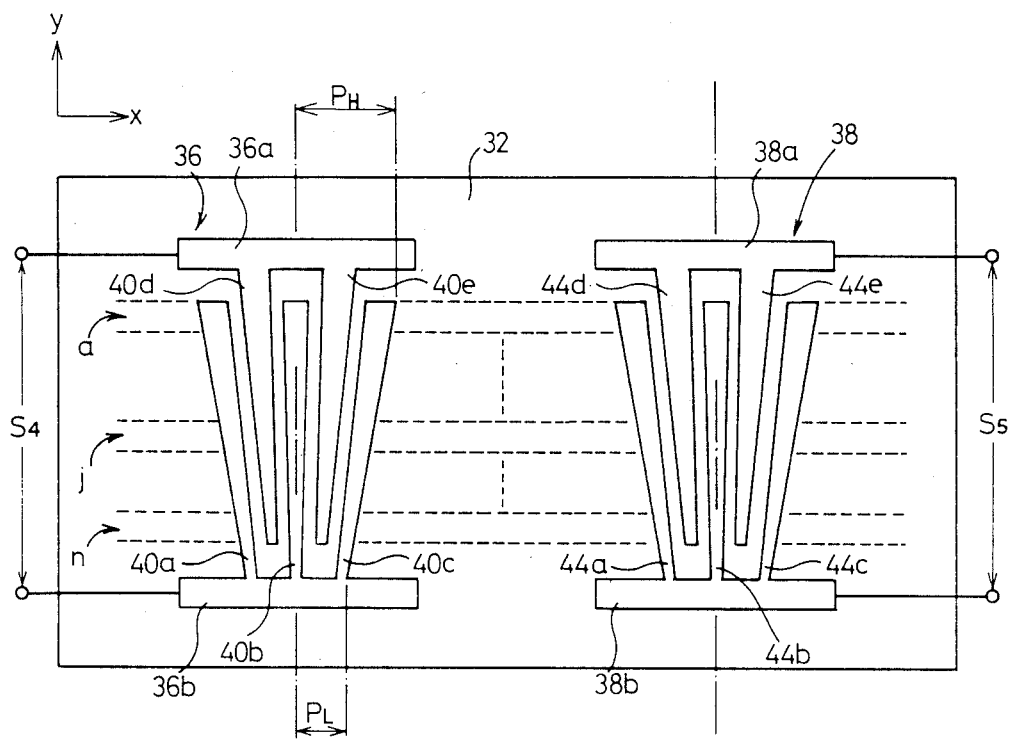
FIG. 2 is a plan view of another conventional surface elastic wave filter with input and output electrodes disposed on a surface layer of a piezoelectric body.
Figure 3:
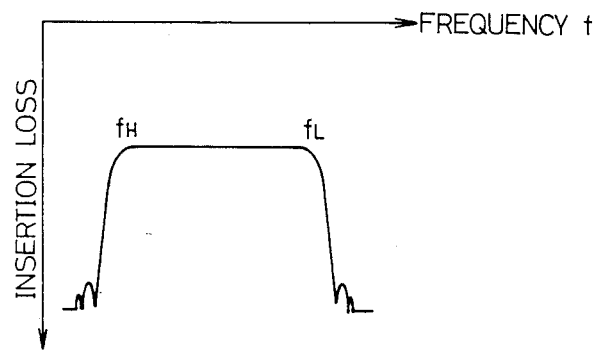
FIGS. 3 and 4 are graphs showing frequency characteristics of the surface elastic wave filter shown in FIG. 2.
Figure 4:
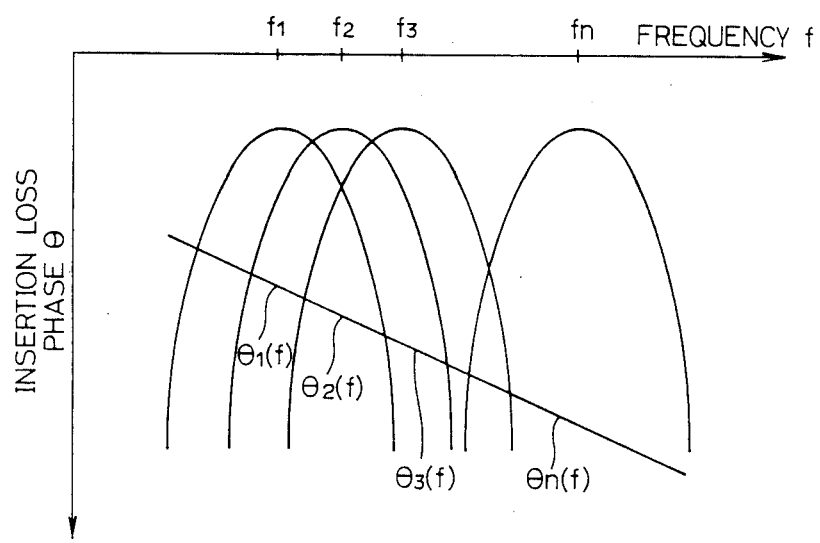

A surface elastic wave device according to the present invention will be described below as being applied to a surface elastic wave filter.

Like or corresponding parts are denoted by like or corresponding reference numerals throughout views.

FIG. 1 shows a surface elastic wave filter according to a first embodiment of the present invention. The surface elastic wave filter, generally denoted at 50, has a piezoelectric substrate 52 and input and output electrodes 54, 56 disposed on the piezoelectric substrate 52 for receiving and sending a high-frequency signal. The input electrode 54 has two common electrodes 60, 62 parallel to and confronting each other for being supplied with a high-frequency signal $S_5$. The output electrode 56 has two common electrodes 64, 66 for issuing a high-frequency signal S.. From the common electrodes 60, 62 and 64, 66, there extend comb-shaped electrode fingers inclined at angles to imaginary lines normal to the common electrodes. More specifically, the common electrode 60 has three divergent electrode fingers 70, 72, 74 spreading along a direction y, and the common electrode 62 has two electrode fingers 76, 78 extending in interdigitating relation to the divergent electrode fingers 70, 72, 74. Likewise, the common electrode 64 has three divergent electrode fingers 82, 84, 88 spreading along the direction y, and the common electrode 66 has two electrode fingers 92, 94 extending in interdigitating relation thereto. The common electrodes and the electrode fingers of the input and output electrodes 54, 56 are formed as electrically closed areas or electric conductors in the form of metallized layers deposited on the piezoelectric substrate 52.

The distance between the central axes of the central electrode fingers of the input and output electrodes 54, 56, e.g., the distance Lj between the central axes of the central electrode fingers 72, 84, progressively varies along the direction y which is substantially normal to a direction x of propagation of a surface elastic wave through the surface elastic wave filter 50.

The surface elastic wave filter 50 of the first embodiment thus constructed will operate as follows:

It is assumed that the surface elastic wave filter 50 has a plurality of propagation channels a through n separate or juxtaposed in the direction y. A surface elastic wave produced from the input electrode 54 in response to application of the input signal S8 is propagated along the propagation channels a through n across the metallized layers or the electrode fingers and nonmetallized areas or electrically open areas toward the output electrode 56. The calculation of the speed at which the surface elastic wave is propagated while encountering different electric boundary conditions as it goes through the metallized layers and the nonmetallized areas is well known in the art, and will not be described in detail.

The distance Lj represents the distance between the central axes of the central electrode fingers of the input and output electrodes 54, 56 at the jth propagation channel. The distances between the central axes of the electrode fingers are progressively different at the propagation channels a through n in the direction y. The central frequency fj and the wavelength γj of a surface elastic wave propagated through the jth propagation channel, the distance Lj between the central axes of the electrode fingers of the input and output electrodes 54, 56 at the jth propagation channel, and the delay time Tj and the group delay τj of the surface elastic wave propagated through the jth propagation channel, are related as follows:

$$\lambda j = v/fj \quad (3)$$
$$Tj = Loj/vo + Lmj/vm \quad (4)$$
$$= Loj*(1/vo + 1/vm) = Lj/v$$
$$\tau j = -d\theta j(f)/d\omega \quad (5)$$

where $v = 2*(vo*vm)/(vo+vm)$, and $$Lj/2 = Loj = Lmj.$$

The group delay rj indicated by the equation (5) is a group delay time in the case where the propagation channels are independent of each other. Actually, the group delay is given as follows by θ(f) that is determined by combining the propagation channels:

$$\tau = -d\theta(f)/d\omega$$

Assuming that the distances of propagation through all the propagation channels are equal, $$L1 = L2 = \ldots = Lj = \ldots = L \ldots \quad (6)$$
$$Tj = Lj/v = T \ldots \quad (7)$$

The frequency difference Δfj and phase difference Δθj between the frequencies fj and fj+1 are given by:

$$\Delta fj = fj + 1 - fj \quad (8)$$
$$\Delta\theta j = 2\pi \cdot L/\lambda j - 2\pi \cdot L/\lambda j + 1 \quad (9)$$
$$= 2\pi \cdot L \cdot (1/v) \cdot (v/\lambda j - v/\lambda j + 1)$$
$$= 2\pi \cdot (L/v) \cdot (fj - fj + 1)$$

The group delay τj of each propagation channel is expressed by:

$$\tau j = -\Delta\theta j/(\Delta fj \cdot 2\pi) \quad (10)$$
$$= L/v$$
$$= T$$
$$\tau j = \tau(fj) = \tau(f) = T$$

Figure 5:
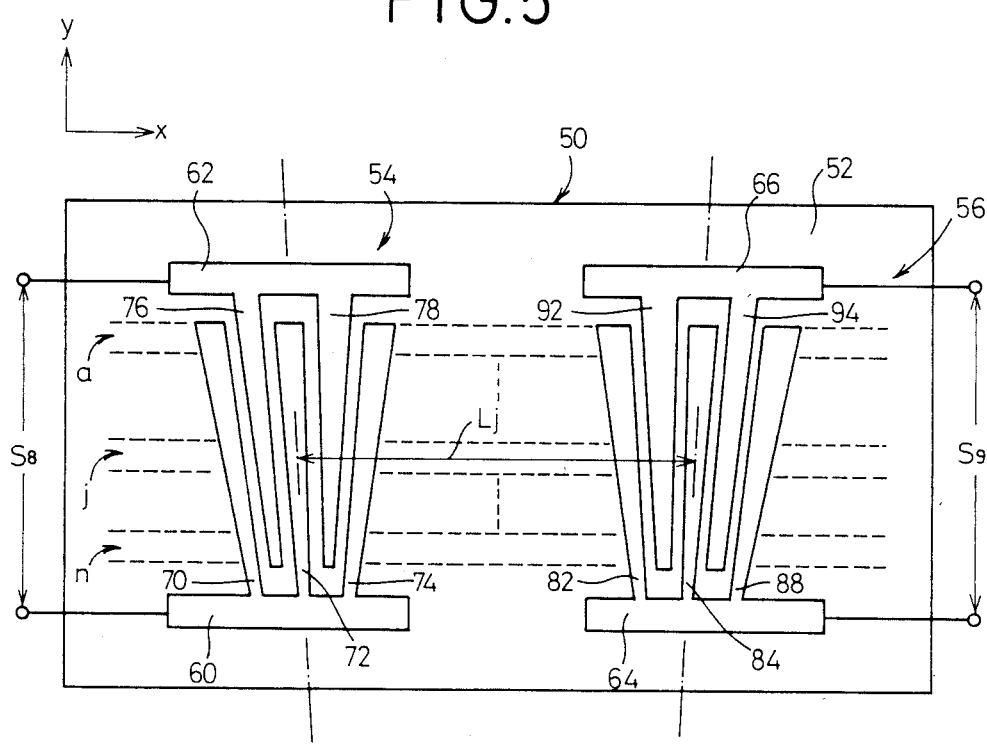
FIG. 5 is a plan view of a surface elastic wave filter according to the present invention, showing input and output electrodes disposed on a surface layer of a piezoelectric body.
Figure 6:
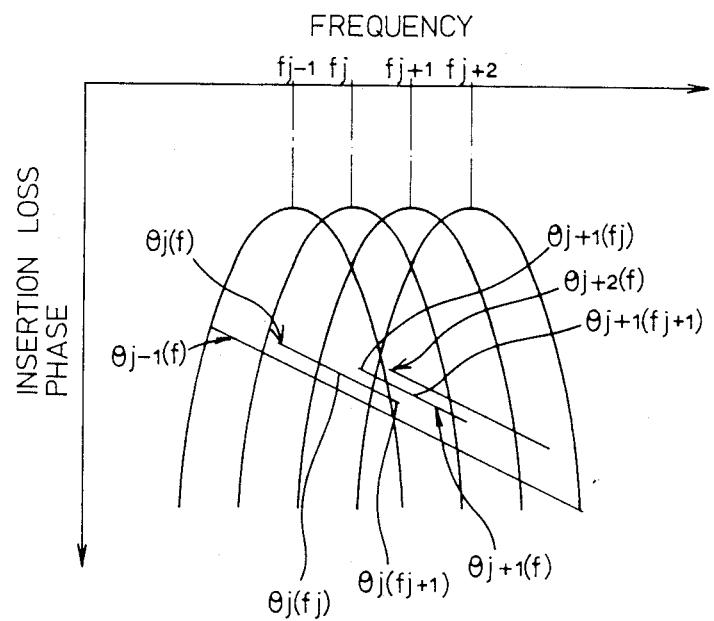
FIG. 6 is a graph showing phases and insertion losses at respective frequencies of the surface elastic wave filter shown in FIG. 5.

Even if the propagation channels are combined, the group delay is constant and equal to the delay time T with respect to every frequency. In the surface elastic wave filter shown in FIG. 5, the distances of propagation through the respective propagation channels are slightly different from each other, and so are the phases of surface elastic waves propagated through the propagation channels. Thus, phase differences are developed by the different propagation distances in the propagation channels a through n. On the assumption that the energy of a surface elastic wave having a frequency fj is concentrated substantially in the jth propagation channel and the energy of a surface elastic wave having a frequency fj+1 is concentrated substantially in the (j+1)th propagation channel, the phase difference Δθj between the frequencies fj and fj+1 is expressed by:

$$\Delta\theta j = 2\pi \cdot Lj/\lambda j - 2\pi \cdot Lj + 1/\lambda j + 1 \quad (11)$$
$$\text{If } Lj - Lj + 1 = \Delta Lj \quad (12)$$

then $$\Delta\theta j = 2\pi \cdot Lj/\lambda j - 2\pi \cdot Lj + 1/\lambda j + 1 \quad (13)$$
$$= 2\pi \cdot (Lj/\lambda j - Lj + 1/\lambda j + 1)$$
$$= 2\pi \cdot (Lj/\lambda j - Lj/\lambda j + 1 + \Delta Lj/\lambda j + 1)$$
$$= 2\pi \cdot (Lj/v) \cdot (fj - fj + 1) + 2\pi \cdot (\Delta Lj/\lambda j + 1)$$

In this case, the group delay τ(fj) is different from the group delay τj in the independent jth propagation channel. If θ(fj) can be regarded as the phase of the combination of the jth and (j+1)th propagation channels, then $$\tau(fj) = -\Delta\theta j/(\Delta fj \cdot 2\pi) \quad (14)$$
$$= Lj/v - 2\pi \cdot (\Delta Lj/\lambda j + 1)/(2\pi \cdot \Delta fj)$$
$$= tj - \Delta\Delta\theta j/\Delta\omega j$$

where $\Delta\Delta\theta j = 2\pi \cdot (\Delta Lj/\lambda j + 1) \quad (15)$
$\Delta\omega j = 2\pi \cdot \Delta fj$ The delay time which is determined by the geometrical distance between propagation channels is given by:

$$tj = Lj/v \quad (16)$$
$$tj + 1 = Lj + 1/v \quad (17)$$
$$\text{If } Lj + 1 - Lj = \Delta Lj \ll Lj + 1, Lj, \quad (18)$$

then $$tj \approx tj + 1 \quad (19)$$

While $\Delta Lj$ is negligible as compared with $Lj$, $Lj+1$, it cannot be neglected in comparison with $\gamma j$. Therefore, $$\tau(f) = tj - \Delta\Delta\theta j/\lambda\omega j \quad (20)$$
$$= tj - \Delta\tau ej$$
$$\text{where } \Delta\tau ej = \Delta\Delta\theta j/\Delta\omega j \quad (21)$$
$$\Delta\tau ej = \Delta\Delta\theta j/\Delta\omega j \quad (22)$$
$$= (\Delta Lj/\lambda j + 1) \cdot (1/\Delta f j)$$
$$= (\Delta Lj/v) \cdot (fj + 1/\Delta j)$$
$$= \alpha \cdot (\Delta Lj/v)$$
$$\text{where } \alpha = fj + 1/\Delta fj.$$

The smaller the difference between $fj+1$ and $fj$, i.e., $\Delta fj$, the greater $\alpha$. If the variation in the phase is smaller than $\pm \pi/2$ as compared with $\Delta Lj/v$, then it is possible to vary group delay characteristics outside of the delay time that is determined by the geometrical distance almost without changing the amplitude characteristics in the sum of vectors of surface wave responses in the propagation channels a through n.

In the propagation channels a through n having central frequencies $fj-1$, $fj$, $fj+1$, $fj+2$, the gradients of the phase characteristics thereof are substantially equal to each other as indicated by the equation (19). However, since the absolute values of the magnitudes of the phases are slightly different as indicated by the following equations, the combined phases are not represented by a straight line:

$$\theta j(f) = 2\pi \cdot Lj/\lambda j + \phi \quad (23)$$
$$\theta j + 1(f) = 2\pi \cdot Lj + 1/\lambda j + \phi \quad (24)$$
$$\theta j(f + 1) = 2\pi \cdot Lj/\lambda j + 1 + \phi \quad (25)$$
$$\theta j + 1(f + 1) = 2\pi \cdot Lj + 1/\lambda j + 1 + \phi \quad (26)$$

With respect to the phase characteristics, the actual phase characteristics vary as compared with the phase characteristics $\theta j(f)$ determined by the distance of the central electroc fingers of the input and output electrodes at the jth propagation channel. The group delay represented by the differential of the angular frequency thereof is different from the delay time tj which is determined by the geometrical distance. However, if the variation in the phase is smaller than $\pm \pi/2$, then the amplitude characteristics of the summed output produced by the sum of vectors of the responses in the propagation channels remain substantially the same.

The design approach for obtaining desired group delay characteristics is simple. Since the differential of the angular frequency of the phase characteristics is group delay characteristics, the phase characteristics are determined as the function of a frequency by integrating desired group delay characteristics. Then, the frequency axis of the propagation channels a through n, i.e., the axis in the direction y, is aligned with that frequency, and $\Delta Lj$ at the propagation channels a through n is determined in order to obtain desired phase characteristics.

Figure 7:
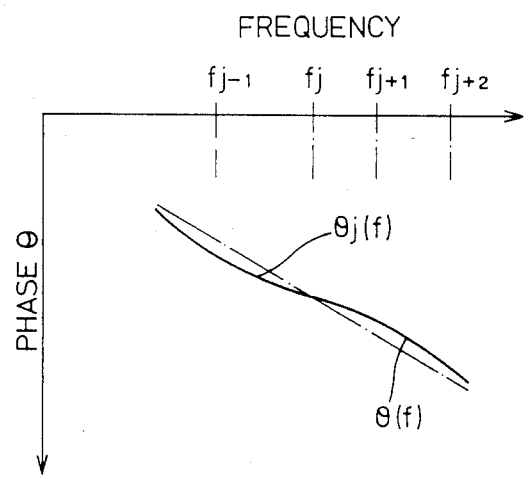
FIG. 7 is a graph showing phases at respective frequencies of a surface elastic wave filter.
Figure 8:
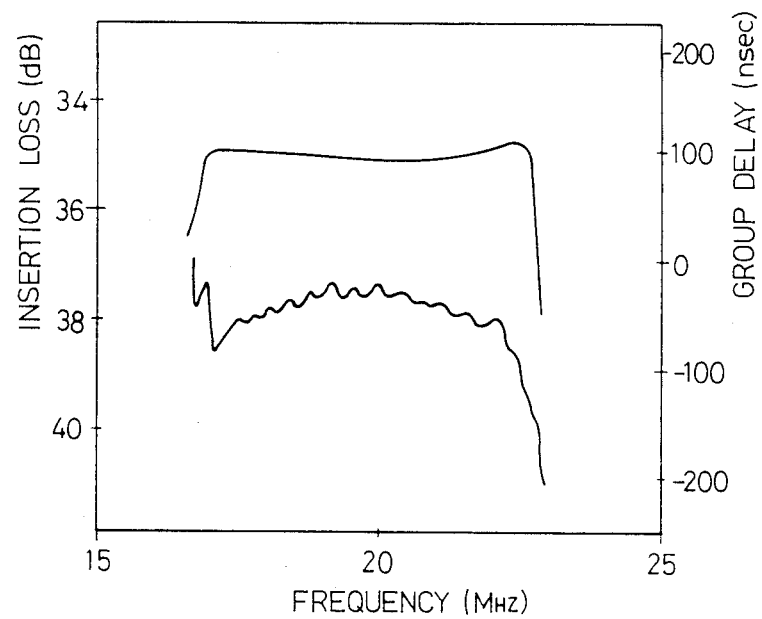
FIG. 8 is a graph illustrating measured phases, insertion losses, and group losses at respective frequencies of the surface elastic wave filter shown in FIG. 5.
Figure 9:
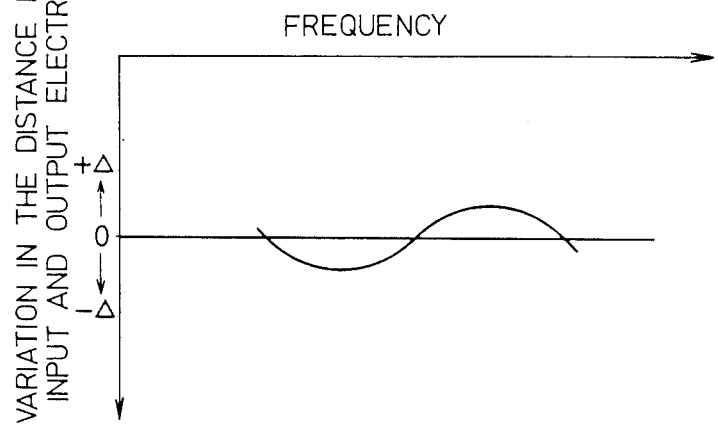
FIG. 9 is a graph showing variations in the distance between the input and output electrodes at respective frequencies of the surface elastic wave filter of FIG. 5.

Actual combined phase characteristics vary as represented by $\theta(f)$ in FIG. 7. The group delay represented by the differential of the angular frequency of the combined phase characteristics is different from the delay time tj determined by the geometrical distance. If the variation in the phase is smaller than $\pm \pi/2$, then the amplitude characteristics remain substantially the same even if the vectors of the responses in the respective propagation channels are summed. A frequency characteristic curve with curved group delay characteristics is shown by way of example in FIG. 8. In order to curve the group delay characteristics, the variations in $\Delta Lj$ are represented by a cubic curve having minimal and maximal values on both sides of the central frequency as shown in FIG. 9.

Figure 10:
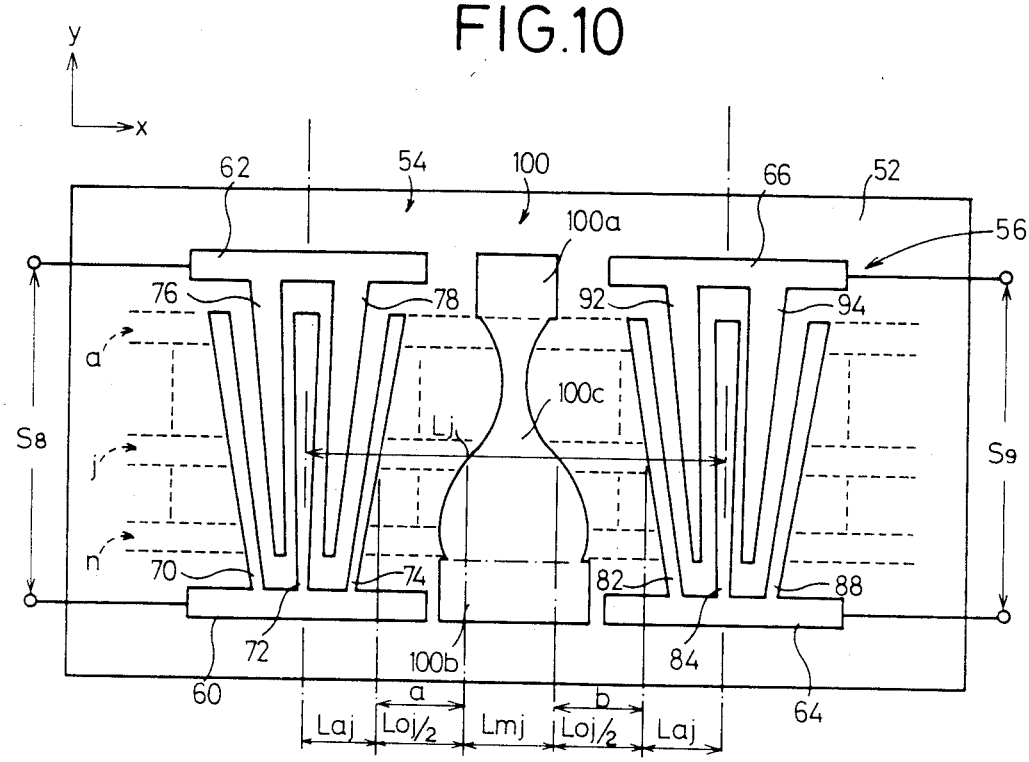
FIG. 10 is a plan view of a surface elastic wave filter according to another embodiment of the present invention, showing input and output electrodes and a phase control and shield/electrode which are disposed on a surface layer of a piezoelectric body.

A surface elastic wave filter according to a second embodiment of the present invention will be described with reference to FIG. 10. The surface elastic wave filter has input and output electrodes 54, 56 disposed on a piezoelectric substrate 52 for receiving and sending a high-frequency signal. The input and output electrodes 54, 56 have parallel and confronting common electrodes 60, 62 and 64, 66, respectively, for receiving a high-frequency signal $S_8$ and issuing a high-frequency signal $S_9$, respectively. The common electrode 60 has three divergent electrode fingers 70, 72, 74, and the common electrode 62 has two electrode fingers 76, 78 in interdigitating relation to the divergent electrode fingers 70, 72, 74. Likewise, the common electrode 64 has three divergent electrode fingers 82, 84, 88, and the common electrode 66 has two electrode fingers 92, 94 in interdigitating relation to the divergent electrode fingers 82, 84, 88. The divergent electrode fingers 72, 74 lie perpendicularly to the common electrodes 60, 62 and 64, 66, respectively. The other electrode fingers are inclined at angles to imaginary lines normal to the common electrodes 60, 62 and 64, 66.

A shield electrode 100 of a gourd shape, which doubles as a phase control electrode, is disposed on the piezoelectric substrate 52 between the input and output electrodes 54, 56. The shield electrode 100 includes rectangular portions 100a, 100b serving as shields for lessening electrical coupling between the input and output electrodes 54, 56. The shield electrode 100 also includes a metallized portion 100c extending between the rectangular portions 100a, 100b across the propagation channels a through n, the metallized portion 100c having different lengths in and along the propagation channels a through n within the distance between the central electrode fingers of the input and output electrodes 54, 56. The metallized portion 100c serves as a phase control member and shield.

The phases of surface elastic waves propagated through the propagation channels a through n are controlled by different electric boundary conditions between the metallized portion 100c and the piezoelectric substrate 52, i.e., the different speeds of propagation of the surface elastic waves through the propagation channels a through n across the metallized portion and nonmetallized areas in the propagation channels a through n.

Operation of the surface elastic wave filter of the second embodiment is as follows:

It is assumed that within the distance Lj between the central axes of the divergent electrode fingers 72, 84 along the propagation channel j, the speed of propagation of the surface elastic wave in an electrically open area or nonmetallized area Loj (which is represented by the su of equal distances a and b in the distance Lj) is indicated by vo, the speed of propagation of the surface elastic wave in an electrically closed area or metallized area Lmj is indicated by vm, and the average speed of propagation of the surface elastic wave in electrode areas Laj of equal lengths in the distance Lj) is indicated by v. The phases $\theta j$, $\theta k$ of the surface elastic waves in the jth propagation path and the kth propagation path (not shown) are expressed as follows:

$$\theta j = 2\pi \cdot (2 \cdot Laj/\gamma aj + Loj/\gamma oj + Lmj/\gamma mj) + \phi$$

$$\theta k = 2\pi \cdot (2 \cdot Lak/\gamma ak + Lok/\gamma ok + Lmk/\gamma mk) + \phi \ldots \quad (27)$$

where $Laj \approx Lak$, $\gamma aj = v/fj$, $\gamma oj = vo/fj$, $\gamma mj = vm/fj$, $\gamma ak = v/fk$, $\gamma ok = vo/fk$, and $\gamma mk = vm/fk$. Even if the distances between the central axes of the electrode fingers 72, 84 in the propagation channels are equal to each other, as indicated by $Loj + Lmj = Lok + Lmk$, a phase difference can be given to the surface elastic waves propagated in the propagation channels by selecting the dimensional relationship of $Lmj \neq Lmk$.

If $Lmj = Lmk + \Delta L$, then the phase difference $\Delta \theta j$ is given by:

$$\begin{aligned} \Delta \theta j &= 2\pi \cdot (\Delta L/\lambda o) - 2\pi(\Delta L/\lambda m) \\ &= 2\pi \cdot \Delta L \cdot (1/\lambda o - 1/\lambda m) \\ &= 2\pi \cdot \Delta L \cdot (fj/vo - fj/vm) \\ &= 2\pi \cdot \Delta L \cdot fj(1/vo - 1/vm) \end{aligned} \quad (28)$$

By using the equation (21), $$(1/vo - 1/vm) = 0.5 \cdot K^2/vo \ldots \quad (29)$$

Therefore, the equation (28) is rewritten as follows:

$$\Delta \theta j = 2\pi \cdot \Delta L \cdot 0.5 \cdot K^2 \cdot fj/vo$$

$$= \Delta L \cdot 2\pi/\gamma o \cdot 0.5 \cdot K^2.$$

In order to vary the phase by ± 6% of the wavelength, if the piezoelectric substrate is made of LiTaO$_3$ of X-112° Y (lithium tantalate, electromechanical coefficient $K^2 = 0.0075$), the following is derived from the last-mentioned equation:

$$\Delta \theta_1/2\pi = 0.12 = \Delta L/\gamma o \cdot 0.5 \cdot K^2$$

Hence, $\Delta L = 32 \cdot \gamma o$, and the difference between the lengths of the shield electrode along the propagation channels is equal to about 32 wavelengths.

Therefore, if the phase or the distance Lj between the central electrode fingers is to be varied by ± 6% of the wavelength, the width of the metallized portion 100c of the shield electrode 100 across the propagation channels a through n should be varied approximately by about 30 times the wavelength in accordance with the second embodiment. This arrangement can obtain nonlinear-phase frequency characteristics relatively accurately in the case where a desired phase variation is very small or the central frequency is high and the wavelength is short.

Figure 11:
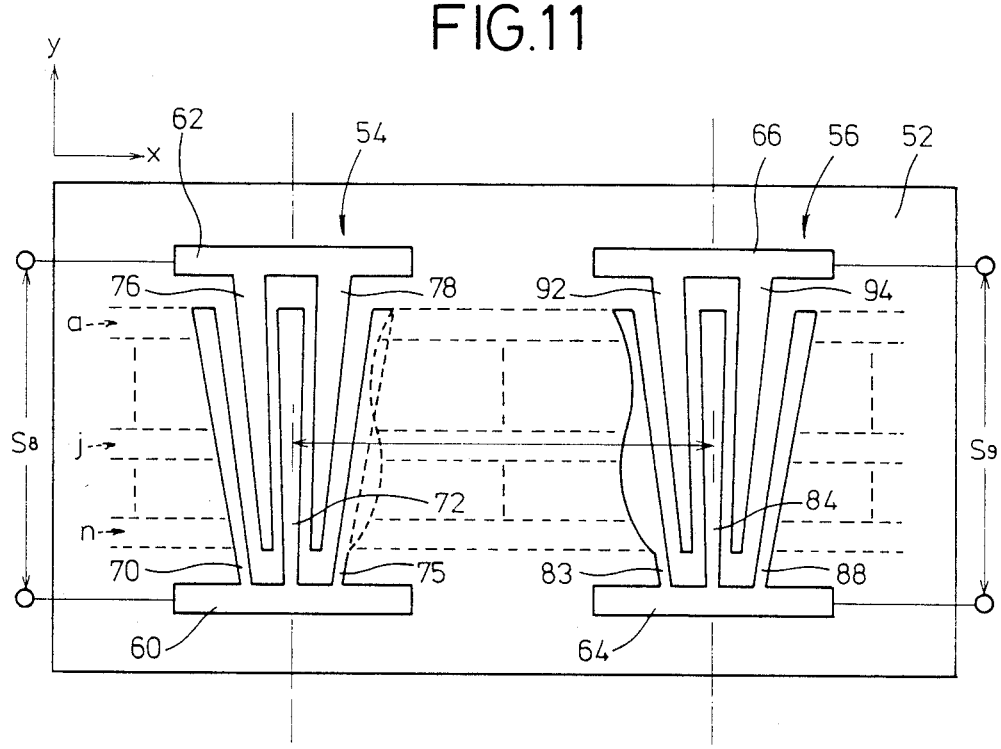
FIG. 11 is a plan view of a surface elastic wave filter according to still another embodiment of the present invention, showing input and output electrodes disposed on a surface layer of a piezoelectric body.

A surface elastic wave filter according to a third embodiment is illustrated in FIG. 11. The surface elastic wave filter of FIG. 11 differs from the surface elastic wave filter of FIG. 5 in that divergent electrode fingers 75, 83 as metallized layers have their widths or lengths in the propagation channels a through n, varying in the direction y which is normal to the direction x of propagation of a surface elastic wave. Operation of the surface elastic wave filter of the third embodiment can easily be understood from the above description of operation of the second embodiment.

Figure 12:
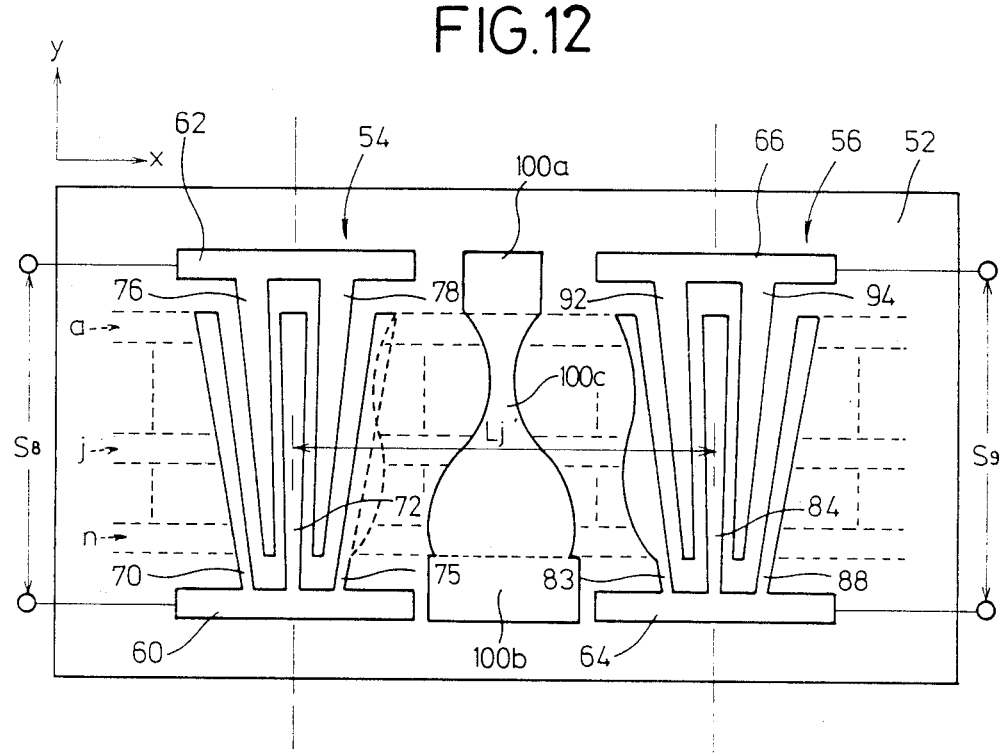
FIG. 12 is a plan view of a surface elastic wave filter according to yet another embodiment of the present invention, showing input and output electrodes and a phase control and shied electrode which are disposed on a surface layer of a piezoelectric body.

According to a fourth embodiment, a surface elastic wave filter shown in FIG. 12 includes divergent electrode fingers 75, 83 as metallized layers have their widths or lengths in the propagation channels a through n, varying in the direction y which is normal to the direction x of propagation of a surface elastic wave, as with the third embodiment shown in FIG. 11. Moreover, a gourd-shaped shield electrode 100 doubling as a phase control electrode is disposed on a piezoelectric body 52 between input and output electrodes 54, 56, as with the second embodiment shown in FIG. 10. The shield electrode 100 includes rectangular portions 100a, 100b serving as shields for lessening electrical coupling between the input and output electrodes 54, 56. The shield electrode 100 also includes a metallized portion 100c extending between the rectangular portions 100a, 100b across the propagation channels a through n, the metallized portion 100c having different lengths in and along the propagation channels a through n within the distance between the central electrode fingers of the input and output electrodes 54, 56. The metallized portion 100c serves as a phase control member and shield.

The phases of surface elastic waves propagated through the propagation channels a through n are controlled by different electric boundary conditions between the metallized portion 100c and the piezoelectric substrate 52, i.e., the different speeds of propagation of the surface elastic waves through the propagation channels a through n across the metallized portion and nonmetallized areas in the propagation channels a through n.

Operation of the surface elastic wave filter of the fourth embodiment can easily be understood from the above description of operation of the second and third embodiments.

Figure 13:
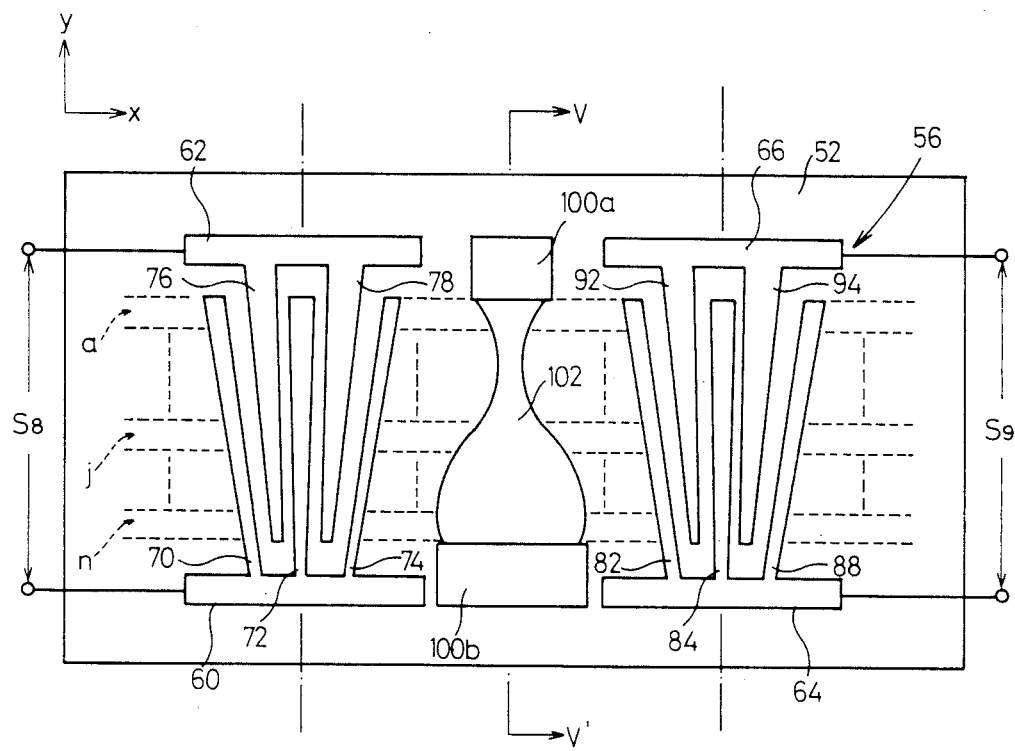
FIG. 13 is a plan view of a surface elastic wave filter according to a further embodiment of the present invention, showing input and output electrodes and a medium which are disposed on a surface layer of a piezoelectric body.
Figure 14:
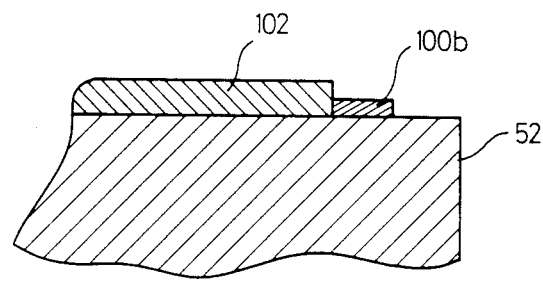
FIG. 14 is a fragmentary cross-sectional view taken along line V—V' of FIG. 13.

FIG. 13 shows a surface elastic filter according to a fifth embodiment of the present invention. The surface elastic wave filter of FIG. 13 includes input and output electrodes 54, 56 disposed on a piezoelectric body 52 having propagation channels a through n, a pair of spaced rectangular shield electrodes 100a, 100b disposed on the piezoelectric body 52 outside of the propagation channels a through n, and a medium 102 disposed on the piezoelectric body 52 across the propagation channels a through n between the shield electrodes 100a, 100b. The medium 102 is in the form of a thin film made of a material, other than an electric conductor, such as silicon dioxide which is capable of varying the speed of propagation of a surface elastic wave. The medium 102 has the same shape as the metallized portion 100c as shown in FIGS. 10 and 12, and operates in the same manner and offers the same advantages as the metallized portion 100c. FIG. 14 fragmentarily shows a cross section taken along line V—V' of FIG. 13.

With the present invention, as described above, the input and output electrodes for sending and receiving a surface elastic wave are disposed on the surface layer of the piezoelectric body, and either the length of the electric conductor between the input and output electrodes in the direction of propagation of the surface elastic wave is varied in the direction normal to the direction of propagation to vary the speed of propagation of the surface elastic wave due to different electric boundary conditions, or the medium for varying the speed of propagation of the surface elastic wave along the surface layer of the piezoelectric body is disposed on the piezoelectric body between the input and output electrodes. A signal is applied to the input electrodes and a signal having desired frequency characteristics in a wide frequency range is produced from the output electrode. The desired frequency characteristics can be achieved accurately in a wide frequency range with increased freedom.

The surface elastic wave filter of the invention provides desired group delay characteristics in a wide frequency range and also nonlinear-phase frequency characteristics in a wide frequency range, and the freedom for phase control to obtain accurate nonlinear-phase frequency characteristics is increased.

Although certain preferred embodiments have been shown and described, it should be understood that many changes and modifications may be made therein without departing from the scope of the appended claims.

What is claimed is:

1. A surface elastic wave device having nonlinear-phase frequency characteristics, comprising a piezoelectric body for propagating a surface elastic wave through a surface layer thereof and first and second electrodes disposed on said surface layer in spaced-apart relationship to each other for sending and receiving the surface elastic wave between the first and second electrodes, each of said first and second electrodes having a pair of common electrodes having comb-shaped electrode fingers extending therebetween, and wherein said first and second electrodes are the only electrodes on said piezoelectric body having comb-shaped electrode fingers, said electrode fingers between the common electrodes of at least one of said first and second electrodes including a plurality of divergent electrode fingers spreading along a direction substantially normal to the direction of propagation of the surface elastic wave, the central electrode finger of said first electrode for substantially sending and receiving the surface elastic wave having a central axis across said direction of propagation, the central electrode finger of said second electrode for substantially sending and receiving the surface elastic wave having a central axis across said direction of propagation, the distance along said direction of propagation between said central axes being varied in said direction substantially normal to said direction of propagation.

2. A surface elastic wave device according to claim 1, further comprising an electric conductor disposed on said surface layer of the piezoelectric body and having a length in said direction of propagation, said length being varied in said direction substantially normal to said direction of propagation, said electric conductor comprising a metallized layer.

3. A surface elastic wave device according to claim 1, wherein those electrode fingers which are disposed between said central axes comprise electric conductors having a dimension in said direction of propagation, said dimension being varied in said direction substantially normal to said direction of propagation, said electric conductors comprising metallized layers, respectively.

4. A surface elastic wave device having nonlinear-phase frequency characteristics, comprising a piezoelectric body for propagating a surface elastic wave through a surface layer thereof, first and second electrodes disposed on said surface layer in spaced-apart relationship to each other for sending and receiving the surface elastic wave between the first and second electrodes, and an electric conductor disposed on said surface layer of the piezoelectric body between said first and second electrodes and having a dimension in said direction of propagation, said dimension being varied in said direction substantially normal to said direction of propagation, each of said first and second electrodes having a pair of common electrodes having comb-shaped electrode fingers extending therebetween, and wherein said first and second electrodes are the only electrodes on said piezoelectric body having comb-shaped electrode fingers, said electrode fingers between the common electrodes of at least one of said first and second electrodes including a plurality of divergent electrode fingers spreading along a direction substantially normal to the direction of propagation of the surface elastic wave said first and second electrodes each having a central electrode finger, the central electrode finger of said first electrode for substantially sending and receiving the surface elastic wave having a central axis across said direction of propagation, the central electrode finger of said second electrode for substantially sending and receiving the surface elastic wave having a central axis across said direction of propagation, the distance along said direction of propagation between said central axes being varied in said direction substantially normal to said direction of propagation.

5. A surface elastic wave device having nonlinear-phase frequency characteristics, comprising a piezoelectric body for propagating a surface elastic wave through a surface layer thereof, and first and second electrodes disposed on said surface layer in spaced-apart relationship to each other for sending and receiving the surface elastic wave between the first and second electrodes, each of said first and second electrodes having a pair of common electrodes having comb-shaped electrode fingers extending therebetween, said electrode fingers between the common electrodes of at least one of said first and second electrodes including a plurality of divergent electrode fingers spreading along a direction substantially normal to the direction of propagation of the surface elastic wave, said first and second electrodes each having a central electrode finger, the central electrode finger of said first electrode having a central axis and the central electrode finger of said second electrode having a central axis, those electrode fingers of said first electrode and/or said second electrode which are disposed between said central axes comprising electric conductors, each of said electric conductors having a dimension in said direction of propagation, said dimension being varied in said direction substantially normal to said direction of propagation.

6. A surface elastic wave device according to claim 5, further comprising an electric conductor disposed on said surface layer of the piezoelectric body between said first and second electrodes and having a dimension in said direction of propagation, said dimension being varied in said direction substantially normal to said direction of propagation, said electric conductor comprising a metallized layer.

7. A surface elastic wave device according to claim 5, wherein those electrode fingers which are disposed between said central axes comprise electric conductors having a dimension in said direction of propagation, said dimension being varied in said direction substantially normal to said direction of propagation, said electric conductors comprising metallized layers, respectively.

8. A surface elastic wave device having nonlinear-phase frequency characteristics, comprising a piezoelectric body for propagating a surface elastic wave through a surface layer thereof, first and second electrodes disposed on said surface layer in spaced-apart relationship to each other for sending and receiving the surface elastic wave between the first and second electrodes, each of said first and second electrodes having a pair of common electrodes having comb-shaped electrode fingers extending therebetween, said electrode fingers between the common electrodes of at least one of said first and second electrodes including a plurality of divergent electrode fingers spreading along a direction substantially normal to the direction of propagation of the surface elastic wave, said first and second electrodes each having a central electrode finger, the central electrode finger of said first electrode for substantially sending and receiving the surface elastic wave having a central axis across said direction of propagation, the central electrode finger of said second electrode for substantially sending and receiving the surface elastic wave having a central axis across said direction of propagation, the distance along said direction of propagation between said central axes being varied in said direction substantially normal to said direction of propagation, and an electric conductor disposed on said surface layer of the piezoelectric body between said first and second electrodes and having a dimension in said direction of propagation, said dimension being varied in said direction substantially normal to said direction of propagation, and wherein those electrode fingers of said first electrode and/or said second electrode which are disposed between said central axes comprise electric conductors, each of said electric conductors having a dimension in said direction of propagation, said dimension being varied in said direction substantially normal to said direction of propagation.

9. A surface elastic wave device having nonlinear-phase frequency characteristics, comprising a piezoelectric body for propagating a surface elastic wave through a surface layer thereof, first and second electrodes disposed on said surface layer in spaced-apart relationship to each other for sending and receiving the surface elastic wave between the first and second electrodes, each of said first and second electrodes having a pair of common electrodes having comb-shaped electrode fingers extending therebetween, and wherein said first and second electrodes are the only electrodes on said piezoelectric body having comb-shaped electric fingers, said electrode fingers between the common electrodes of at least one of said first and second electrodes including a plurality of divergent electrode fingers spreading along a direction substantially normal to the direction of propagation of the surface elastic wave, said first and second electrodes each having a central electrode finger, the central electrode finger of said first electrode for substantially sending and receiving the surface elastic wave having a central axis across said direction of propagation, the central electrode finger of said second electrode for substantially sending and receiving the surface elastic wave having a central axis across said direction of propagation, the distance along said direction of propagation between said central axes being varied in said direction substantially normal to said direction of propagation, and a medium disposed across said propagation channels between said first and second electrodes for varying the speed of propagation of the surface elastic wave through said surface layer.

10. A surface elastic wave device according to claim 9, wherein said medium comprises a thin film of silicon dioxide.

* * * * *